United States Patent
Gemmeke et al.

(10) Patent No.: US 8,452,824 B2
(45) Date of Patent: May 28, 2013

(54) BINARY LOGIC UNIT AND METHOD TO OPERATE A BINARY LOGIC UNIT

(75) Inventors: Tobias Gemmeke, Stutensee (DE); Jochen Preiss, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 1624 days.

(21) Appl. No.: 11/872,846

(22) Filed: Oct. 16, 2007

(65) Prior Publication Data

US 2008/0162897 A1 Jul. 3, 2008

(30) Foreign Application Priority Data

Oct. 17, 2006 (EP) .................................... 06122406

(51) Int. Cl.
*G06F 15/00* (2006.01)
(52) U.S. Cl.
USPC ........................................................ 708/200

(58) Field of Classification Search
USPC ............................................................ 708/200
See application file for complete search history.

(56) References Cited

U.S. PATENT DOCUMENTS

| | | | |
|---|---|---|---|
| 6,621,298 B2 * | 9/2003 | Agrawal et al. | 326/50 |
| 7,185,035 B1 * | 2/2007 | Lewis et al. | 708/235 |
| 2008/0136449 A1 * | 6/2008 | Hutton et al. | 326/47 |

* cited by examiner

*Primary Examiner* — Tan V. Mai
(74) *Attorney, Agent, or Firm* — Roy W. Truelson

(57) ABSTRACT

A binary logic unit to apply any Boolean operation on two input signals ($v_a$, $v_b$) is described, wherein any Boolean operation to be applied on the input signals ($v_a$, $v_b$) is defined by a particular combination of well defined control signals (ctl0, ctl1, ctl2, ctl3), wherein the input signals ($v_a$, $v_b$) are used to select a control signal (ctl0, ctl1, ctl2, ctl3) as an output signal ($v_o$) of the binary logic unit representing the result of a particular Boolean operation applied on the two input signals ($v_a$, $v_b$). Furthermore a method to operate such a binary logic unit is described.

4 Claims, 8 Drawing Sheets

Fig. 8A Table 1

Fig. 8B Table 2

BINARY LOGIC UNIT AND METHOD TO OPERATE A BINARY LOGIC UNIT

BACKGROUND OF THE INVENTION

The invention relates to a binary logic unit to apply any desired Boolean operation on two input signals plus a method to operate such a binary logic unit.

A binary logic unit used to apply logic Boolean operations on two input signals $v_a$, $v_b$ comprises a plurality of basic logic gates like AND, OR, XOR and XNOR gates, each one consisting of one or more transistors. Table 1, shown in FIG. 8, gives an overlook over the Boolean operations that can be performed on two input signals $v_a$, $v_b$ by a binary logic unit.

A binary logic unit 1 according to the state of the art is shown in FIG. 1. It is a static CMOS realization of thirty-eight transistors that are arranged to different logic gates 2. The logic gates 2 are a 4:1 multiplexer 3, a 2:1 multiplexer 4, two XOR-gates 5, 6, and two inverters 7, 8. The logic gates 2 are controlled by control signals ctl switching the transistors of the logic gates 2 in a way that an output signal $v_o$ of the binary logic unit 1 is achieved equivalent to the result of a desired Boolean operation applied on the input signals $v_a$, $v_b$.

The principle of such a binary logic unit is shown in FIG. 2. Thereby the two input signals $v_a$, $v_b$ are linked to a number of combinatory circuits 11 equal to the number of Boolean operations to be applied on the two input signals $v_a$, $v_b$. The results of these Boolean operations are applied on the data inputs of a multiplexer 12. A control signal ctl applied on the control input of the multiplexer 12 selects the result according to the desired Boolean operation.

Regarding FIG. 1, in order to implement this principle, the input signal $v_a$ is applied on the XOR-gate 5 and the input signal $v_b$ is applied on the XOR-gate 6 and together with its inverse on two data inputs of the 4:1 multiplexer 3. Two static signals marked with '1' and '0' are applied on the remaining two data inputs of the 4:1 multiplexer 3. The 4:1 multiplexer 3 is controlled by a pair of control signals applied on the control inputs of the 4:1 multiplexer 3. Each of the XOR-gates 5, 6 is also controlled by a control signal respectively. The 2:1 multiplexer 4 is controlled by the output of the XOR-gate 5 wherein the outputs of the other XOR-gate 5 and of the 4:1 multiplexer 3 are fed in the data inputs of the 2:1 multiplexer 4. The output signal $v_o$ of the 2:1 multiplexer 4 is the result of a Boolean operation selected by the control signals and applied on the input signals $v_a$, $v_b$.

It can be seen that the implementation of a binary logic unit according to the state of the art requires many transistors and in consequence of this also a large silicon area. Thereby in modern microprocessors power consumption particularly due to leakage power is a huge problem and is to be reduced. According to a rule of thumb, leakage power is a function of silicon area. The larger the silicon area required, the higher the leakage power suffered.

As a binary logic unit performs on each input bit in any logic unit within a microprocessor, like e.g., a vector unit such as VMX used in IBM PowerPC and POWER processors, a realization for a single bit with reduced power consumption and with a reduced requirement of silicon area would have a noticeable impact on the total power consumption and size of any chip.

SUMMARY OF THE INVENTION

It is therefore an object, of at least one embodiment, of the invention to provide a binary logic unit with reduced silicon area requirement consequence of which is a reduced power consumption and leakage power. It is also an object of the invention to provide a method to operate such a binary logic unit.

In an embodiment of the invention, the invention comprises a binary logic unit to apply any desired Boolean operation on input signals wherein any desired Boolean operation to be applied on the input signals of the binary logic unit is defined by a particular combination of well defined control signals that are fed into the binary logic unit, wherein the input signals are used to select a control signal as an output signal of the binary logic unit representing the result of a particular Boolean operation applied on the input signals.

In general, the binary logic unit according to the invention works according to a multiplexer principle, wherein data and control inputs of the multiplexer are interchanged in a way that the input signals are applied on the control inputs of the multiplexer and the control signals are applied on the data inputs of the multiplexer, and wherein depending on a desired Boolean operation defined by a particular combination of the control signals, the input signals are used to select a control signal as an output signal of the multiplexer representing the result of the particular Boolean operation applied on the input signals.

Applying the multiplexer principle on a binary logic unit, in combination with interchanging control and data inputs, allows to significantly reduce the number of transistors required to implement a binary logic unit. Thereby silicon area requirement of a binary logic according to the invention and in consequence of that power consumption and leakage power are reduced.

In a preferred embodiment of the invention, the binary logic unit is implemented with one 4:1 multiplexer, wherein four well defined control signals are used to specify any Boolean operation to be applied on two input signals, wherein each one of the four control signals is applied on one of the four data inputs of the multiplexer respectively and each one of the two input signals is applied on one of the two control inputs of the multiplexer respectively and wherein the input signals select one of the control signals applied on the data inputs as an output signal representing the result of a particular Boolean operation specified by the control signals.

In another embodiment of the invention, the binary logic unit is implemented with three 2:1 multiplexers, a first and a second one arranged in parallel to each other and a third one arranged in series to the first and second ones, wherein a first input signal and its inverse are applied on the control inputs of the first and second multiplexer arranged in parallel to each other, a first pair of control signals is applied on the signal inputs of the first of the two parallel multiplexers and a second pair of control signals is applied on the signal inputs of the second of the two parallel multiplexers, wherein a second input signal and its inverse are applied on the control inputs of the third multiplexer arranged in series to the first and second multiplexer, wherein the output signal of the first multiplexer is applied on a first data input of the third multiplexer, wherein the output signal of the second multiplexer is applied on a second data input of the third multiplexer, and wherein the output of the third multiplexer represents the result of a Boolean operation specified by the four control signals that is applied on the two input signals. Using three 2:1 multiplexers represents an implementation of the binary logic according to the invention that requires a very small number of transistors. Using a suitable selection of control signals for implementing the binary logic with three 2:1 multiplexers requires eighteen transistors only in order to generate an output signal representing the result of any Boolean operation applied on the two input signals. This is equivalent to a saving of 53% of transistors, silicon area and leakage power compared with the state of the art. Thereby it is important that a 4:1 multiplexer can be implemented with three 2:1 multiplexers as described above.

In an additional embodiment of the invention, the binary logic unit is implemented with three AND/OR-gates each one consisting of two AND-gates arranged parallel to each other and one OR-gate arranged in series to the AND-gates. A first and a second AND/OR-gate of the binary logic unit are arranged parallel to each other and a third one is arranged in series to the first and second one. A first control signal and a first input signal are applied on the inputs of a first AND-gate of the first AND/OR-gate. A second control signal and the inverse of the first input signal are applied on the inputs of a second AND-gate of the first AND/OR-gate. A third control signal and the first input signal are applied on the inputs of a first AND-gate of the second AND/OR-gate. A fourth control signal and the inverse of the first input signal are applied on the inputs of a second AND-gate of the second AND/OR-gate. The output of the first AND/OR-gate and a second input signal are applied on a first AND-gate of the third AND/OR-gate and the output of the second AND/OR-gate and the inverse of the second input signal are applied on a second AND-gate of the third AND/OR-gate. An output signal of the third AND/OR-gate represents the result of a Boolean operation specified by the four control signals that is applied on the two input signals. Implementing the binary logic unit according to the invention with AND/OR-gates allows reducing the number of transistors required to twenty-eight. This is equivalent to a saving of 26% of transistors, silicon area and power leakage compared with the state of the art.

In yet another embodiment of the invention, the binary logic unit is implemented with an evaluation network of a dynamic gate. In the case of complex gates like a 4:1 multiplexer dynamic gates have comparable smaller footprint. Furthermore dynamic gates allow reducing the number of transistors required to nineteen. This is equivalent to a saving of 50% of transistors, silicon area and power leakage compared with the state of the art.

According to another embodiment of the invention, the evaluation network of a dynamic gate consists of four parallel rows of three serial transistors respectively, wherein in each row a first transistor is switched by one of the control signals respectively, a second one by a first input signal or its inverse and a third one by a second input signal or its inverse. Implementing the binary logic unit according to the invention with such an evaluation network of a dynamic gate allows to reduce the number of transistors required to twenty-one. This is equivalent to a saving of 45% of transistors, silicon area and power leakage compared with the state of the art.

According to another embodiment of the invention, the evaluation network of a dynamic gate consists of four parallel rows of two serial transistors respectively, wherein in each row a first transistor is switched by one of the control signals respectively and a second transistor is switched by a first input signal or its inverse, wherein the four parallel rows are grouped to a first and a second pair, each one comprising one row with a transistor switched by the first input signal and one row with a transistor switched by the inverse of the first input signal respectively, wherein each pair is arranged in series to a third transistor respectively, wherein the third transistor arranged in series to the first pair is switched by a second input signal and the third transistor arranged in series to the second pair is switched by the inverse of the second input signal. Implementing the binary logic unit according to the invention with such an evaluation network of a dynamic gate allows reducing the number of transistors required to nineteen. This is equivalent to a saving of 50% of transistors, silicon area and power leakage compared with the state of the art.

In a second aspect, the invention provides a method to operate a binary logic unit mentioned above to apply any Boolean operation on two input signals, said method comprises the steps of:
i) well defining any Boolean operation to be applied on two input signals by particular combinations of well defined control signals, and
ii) selecting a control signal as an output signal of the binary logic unit by the input signals, which control signal represents the result of a particular Boolean operation applied on the two input signals.

Thereby the control signals are well defined in a way, that a control signal selected as an output signal by any particular pair of input signals represents the result of a desired Boolean operation applied on the two input signals.

The method according to the invention allows a realization of a binary logic unit with less transistors, consequence of which the binary logic unit according to the invention has a reduced silicon area requirement, reduced cost and reduced power consumption.

According to a preferred embodiment of the method according to the invention, control and data inputs of a binary logic unit are interchanged in a way that the input signals are applied on the control inputs and control signals specifying a desired Boolean operation are applied on the data inputs, wherein the input signals select a particular control signal representing the result of the particular desired Boolean operation applied on the input signals.

According to another embodiment of the method according to the invention, the binary logic works according to a multiplexer principle, wherein four control signals of which particular combinations specify any Boolean operation to be applied on the input signals are applied on four data inputs of the multiplexer and the input signals are applied on two control inputs of the multiplexer in order to select a particular control signal representing the result of a particular desired Boolean operation applied on the input signals as an output signal of the multiplexer.

BRIEF DESCRIPTIONS OF THE DRAWINGS

The foregoing, together with other objects, features, and advantages of this invention can be better appreciated with reference to the following specification, claims and drawings.

Figures 8A, 8B:
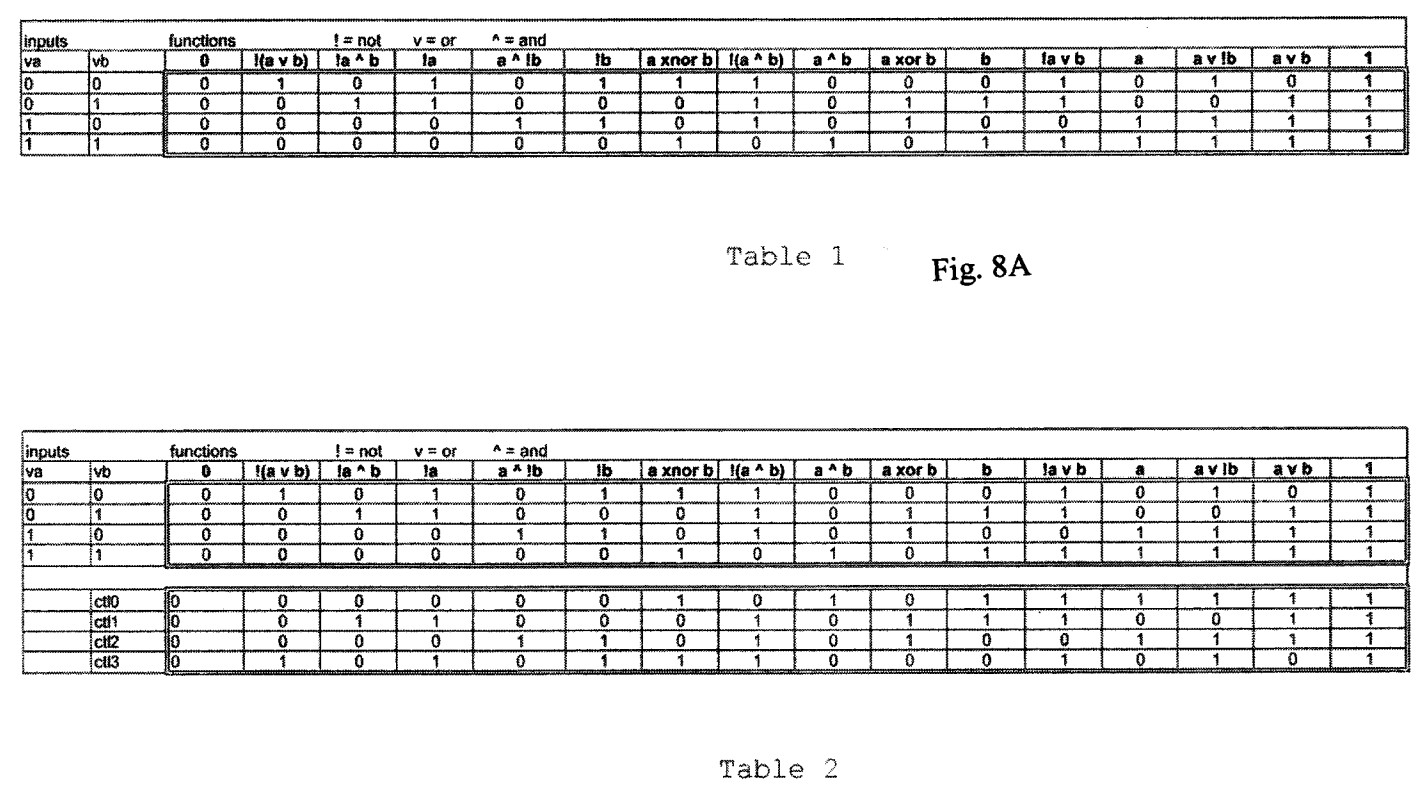

FIG. 8, Table 1, shows an overlook over the Boolean operations applicable on two input signals;

FIG. 8, Table 2, shows an overlook over control signals specifying Boolean operations applicable on two input signals which can be used for a binary logic unit according to the invention.

DETAILED DESCRIPTION

In a binary logic unit according to the invention, any desired Boolean operation to be applied on the input signals of the binary logic unit is defined by a particular combination of well defined control signals that are fed into the binary logic unit. The input signals are used to select one control signal of a particular combination of control signals that define a particular desired Boolean operation to be applied on the input signals as an output signal of the binary logic unit. The selected control signal that is the output signal represents the result of the particular Boolean operation applied on the two input signals. The binary logic unit according to the invention works according to a multiplexer principle. Thereby data and control inputs of the multiplexer are interchanged in a way that the input signals are applied on the control inputs of the multiplexer and the control signals are applied on the data inputs of the multiplexer. Depending on a desired Boolean operation defined by a particular combination of the control signals, the input signals are used to select a control signal as an output signal of the multiplexer representing the result of the particular Boolean operation applied on the two input signals.

Figure 1:
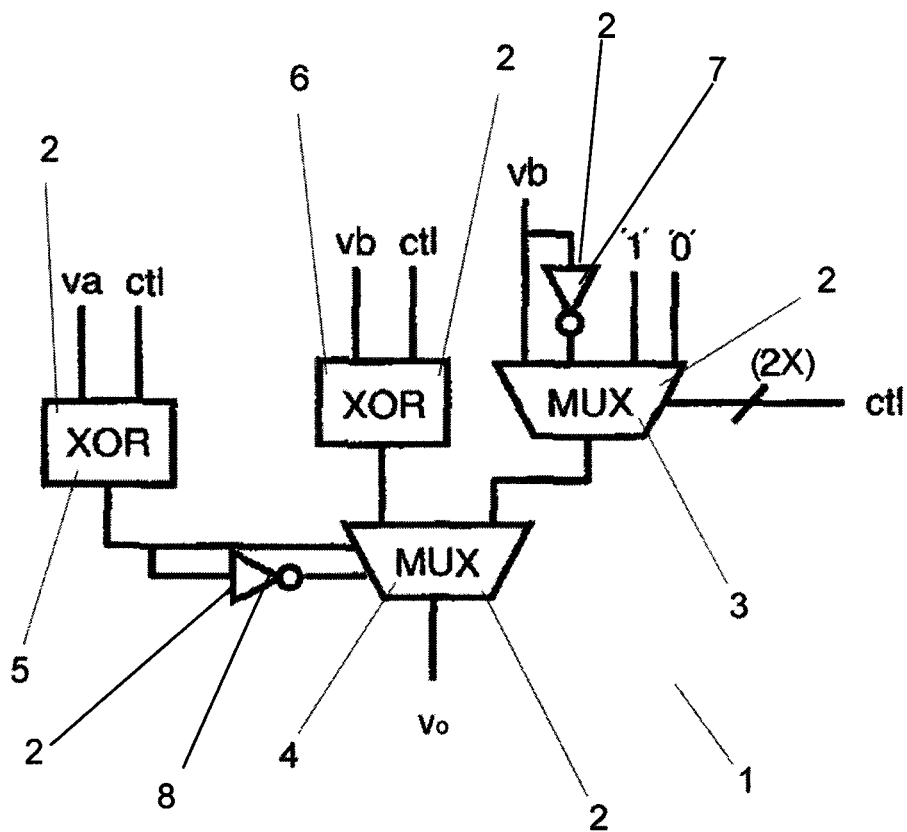
FIG. 1 shows a scheme of a binary logic according to the state of the art.
Figure 2:
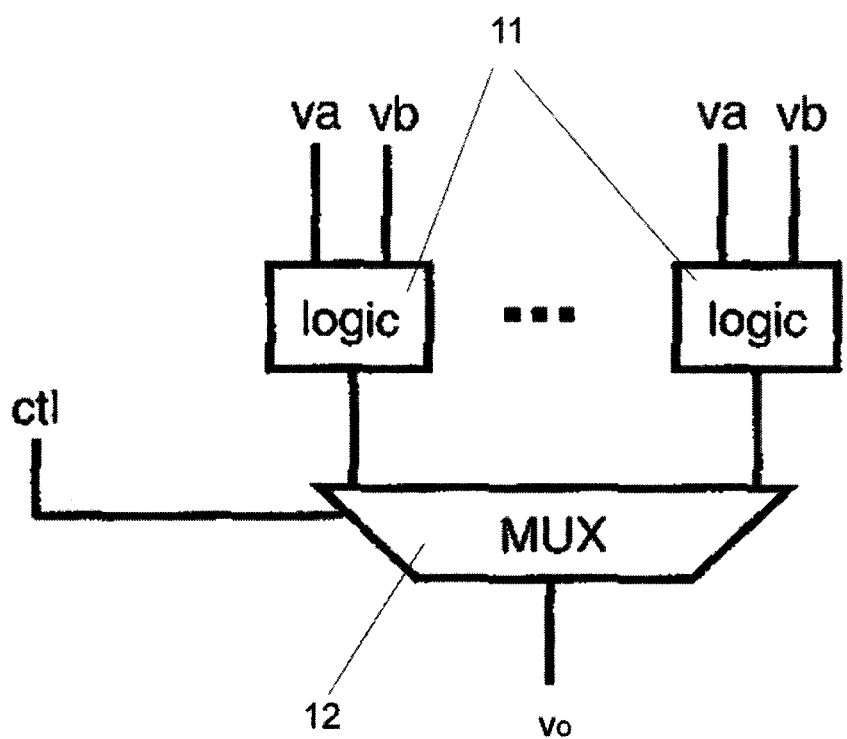
FIG. 2 shows a scheme of the principle of a binary logic according to the state of the art.
Figure 3:
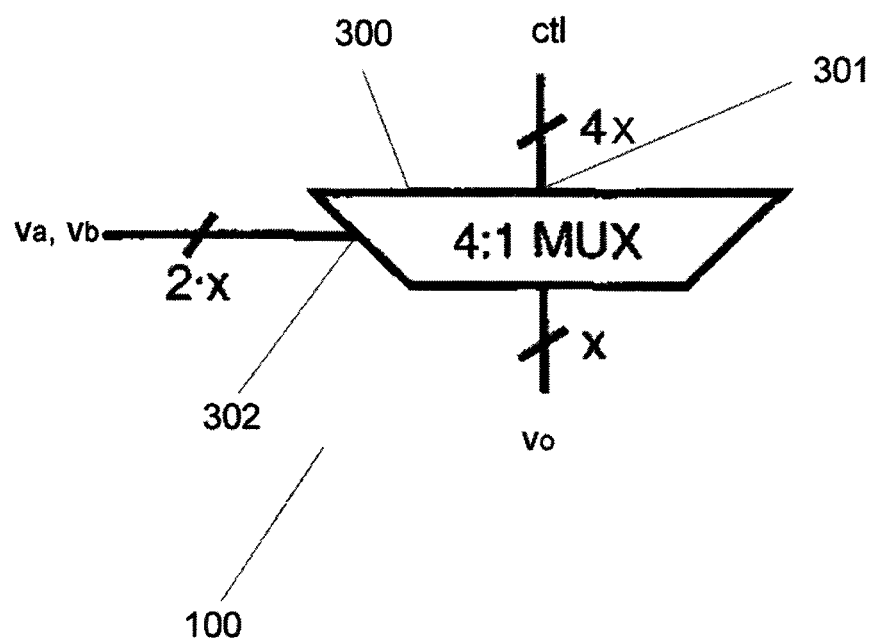
FIG. 3 shows a first implementation of a binary logic according to the invention implemented with a 4:1 multiplexer.

A binary logic unit 100 shown in FIG. 3 is implemented with one 4:1 multiplexer 300. Four well defined control signals ctl are used to specify any Boolean operation to be applied on two input signals $v_a$, $v_b$. Each one of the four control signals ctl is applied on one of the four data inputs 301 of the multiplexer 300 respectively and each one of the two input signals $v_a$, $v_b$ is applied on one of the two control inputs 302 of the multiplexer 300 respectively. Within the multiplexer 300 the input signals $v_a$, $v_b$ applied on the control inputs 302 select one of the control signals ctl applied on the data inputs 301 as an output signal $v_o$ representing the result of a particular Boolean operation specified by the control signals ctl.

Table 2, depicted on FIG. 8, gives an overlook over the Boolean operations executable by a binary logic unit according to the invention plus an overlook over well-defined control signals ctl0, ctl1, ctl2, ctl3 specifying the particular Boolean operations. The control signals ctl0, ctl1, ctl2, ctl3 specify the Boolean operations in a way that when selecting a particular control signal ctl0, ctl1, ctl2, ctl3 by a particular pair of input signals $v_a$, $v_b$ within the binary logic unit, the control signal ctl0, ctl1, ctl2, ctl3 selected represents the result of a particular Boolean operation applied on said pair of input signals $v_a$, $v_b$.

Applying the multiplexer principle on a binary logic unit in combination with interchanging control and data inputs allows significantly reducing the number of transistors required to implement a binary logic unit. Due to this silicon area requirement of a binary logic according to the invention and in consequence of that power consumption and leakage power are reduced.

Figure 4:
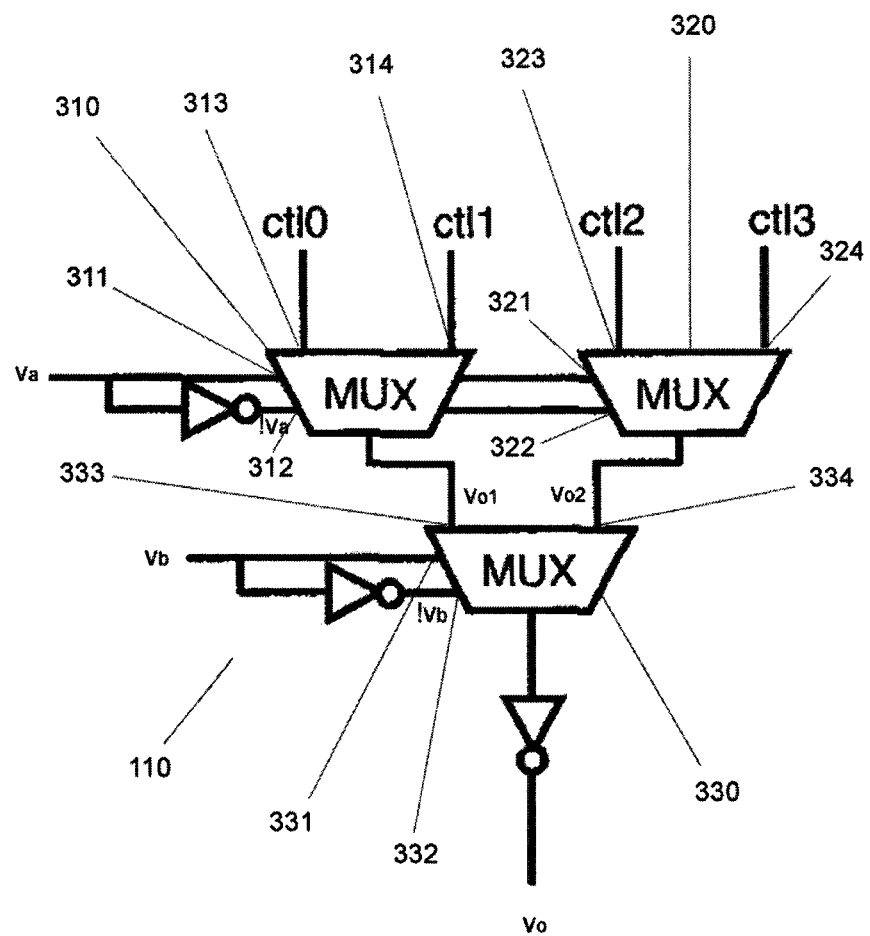
FIG. 4 shows a second implementation of a binary logic according to the invention implemented with three 2:1 multiplexers.

A binary logic unit 110 shown in FIG. 4 is implemented with three 2:1 multiplexers 310, 320, 330. A first 310 and a second multiplexer 320 are arranged in parallel to each other and a third multiplexer 330 is arranged in series to the first 310 and second 320 ones. A first input signal $v_a$ and its inverse $!v_a$ are applied on the control inputs 311, 312 of the first multiplexer 310 and on the control inputs 321, 322 of the second multiplexer 320. A first pair of control signals ctl0, ctl1 is applied on the signal inputs 313, 314 of the first multiplexer 310 and a second pair of control signals ctl2, ctl3 is applied on the signal inputs 323, 324 of the second multiplexer 320. A second input signal $v_b$ and its inverse $!v_b$ are applied on the control inputs 331, 332 of the third multiplexer 330 arranged in series to the first 310 and second multiplexer 320. The output signal $v_{o1}$ of the first multiplexer 310 is applied on a first data input 333 of the third multiplexer 330. The output signal $v_{o2}$ of the second multiplexer 320 is applied on a second data input 334 of the third multiplexer 330. The output $v_o$ of the third multiplexer 330 represents the result of a Boolean operation specified by the four control signals ctl0, ctl1, ctl2, ctl3 that is applied on the two input signals $v_a$, $v_b$. Using three 2:1 multiplexers 310, 320, 330 represents an implementation of the binary logic 110 according to the invention that requires a very small number of transistors. Depending on a skilled selection of the control signals ctl0, ctl1, ctl2, ctl3 implementing the binary logic with three 2:1 multiplexers 310, 320, 330 only requires eighteen transistors in order to generate an output signal $v_o$ representing the result of any Boolean operation applied on the two input signals $v_a$, $v_b$. This is equivalent to a saving of 53% of transistors, silicon area and power leakage compared with the state of the art.

Figure 5:
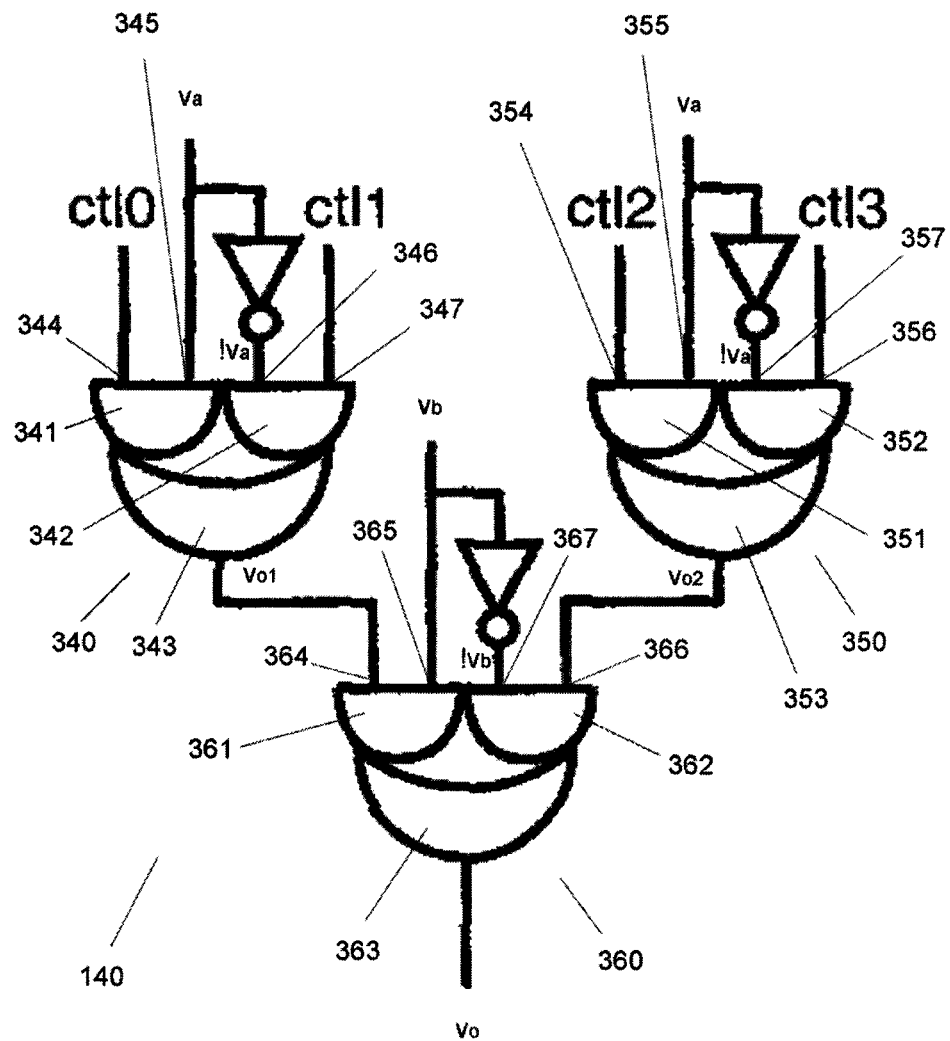
FIG. 5 shows a third implementation of a binary logic according to the invention implemented with three AND/OR-gates.

A binary logic unit 140 shown in FIG. 5 is implemented with three AND/OR-gates 340, 350, 360. Each AND/OR-gate 340, 350, 360 consists of two AND-gates 341, 342, 351, 352, 361, 362 arranged parallel to each other and one OR-gate 343, 353, 363 arranged in series to the AND-gates 341, 342, 351, 352, 361, 362. A first 340 and a second AND/OR-gate 350 of the binary logic unit 140 are arranged parallel to each other. A third AND/OR-gate 360 of the binary logic unit 140 is arranged in series to the first 340 and second 350 AND/OR-gates. A first control signal ctl0 and a first input signal $v_a$ are applied on the inputs 344, 345 of a first AND-gate 341 of the first AND/OR-gate 340. A second control signal ctl1 and the inverse of the first input signal $!v_a$ are applied on the inputs 346, 347 of a second AND-gate 342 of the first AND/OR-gate 340. A third control signal ctl2 and the first input signal $v_a$ are applied on the inputs 354, 355 of a first AND-gate 351 of the second AND/OR-gate 350. A fourth control signal ctl3 and the inverse of the first input signal $!v_a$ are applied on the inputs 356, 357 of a second AND-gate 352 of the second AND/OR-gate 350. The output $v_{o1}$ of the first AND/OR-gate 340 and a second input signal $v_b$ are applied on the inputs 364, 365 of a first AND-gate 361 of the third AND/OR-gate 360. The output $v_{o2}$ of the second AND/OR-gate and the inverse $!v_b$ of the second input signal are applied on the inputs 366, 367 of a second AND-gate 363 of the third AND/OR-gate 360. The output signal $v_o$ of the third AND/OR-gate 360 represents the result of a Boolean operation specified by the four control signals ctl0, ctl1, ctl2, ctl3 that is applied on the two input signals $v_a$, $v_b$. Implementing the binary logic unit 140 with AND/OR-gates 340, 350, 360 allows to reduce the number of transistors required to twenty-eight. This is equivalent to a saving of 26% of transistors, silicon area and power leakage compared with the state of the art.

Figure 6:
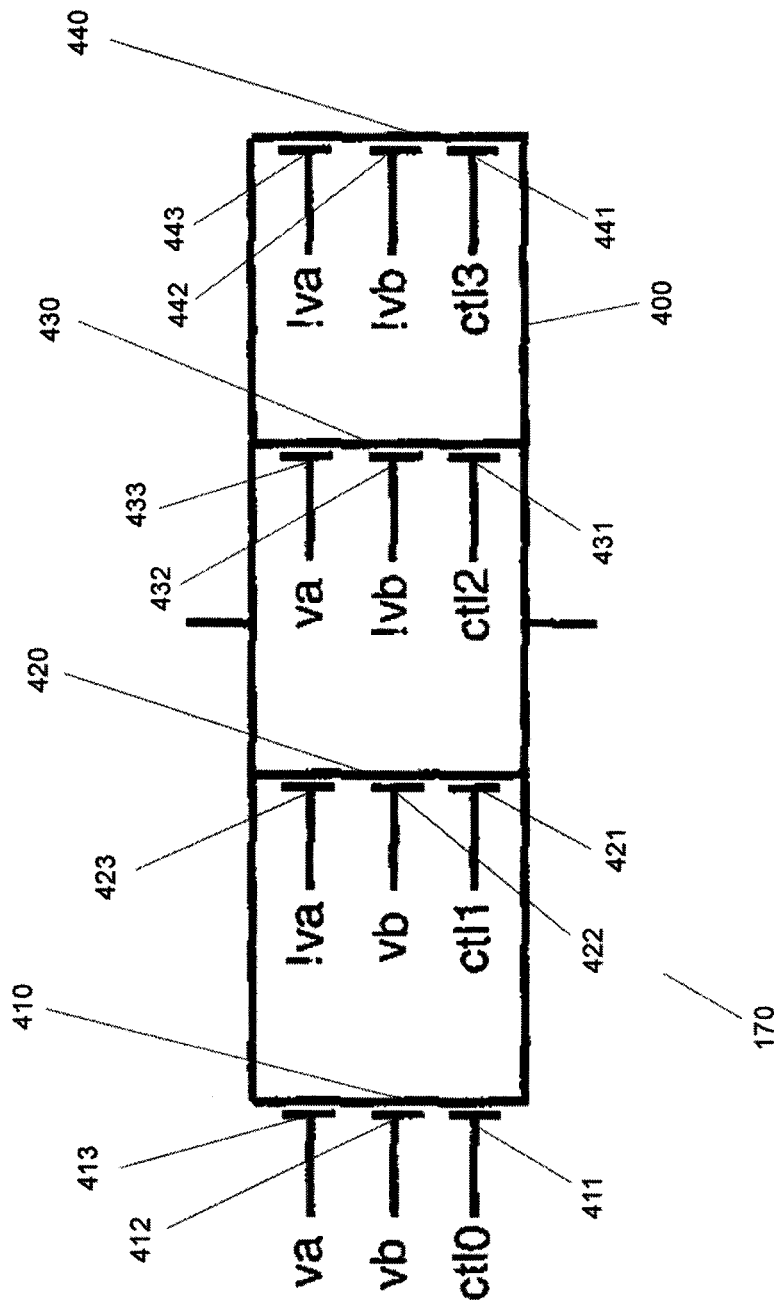
FIG. 6 shows a fourth implementation of a binary logic according to the invention implemented with an evaluation network of a dynamic gate.
Figure 7:
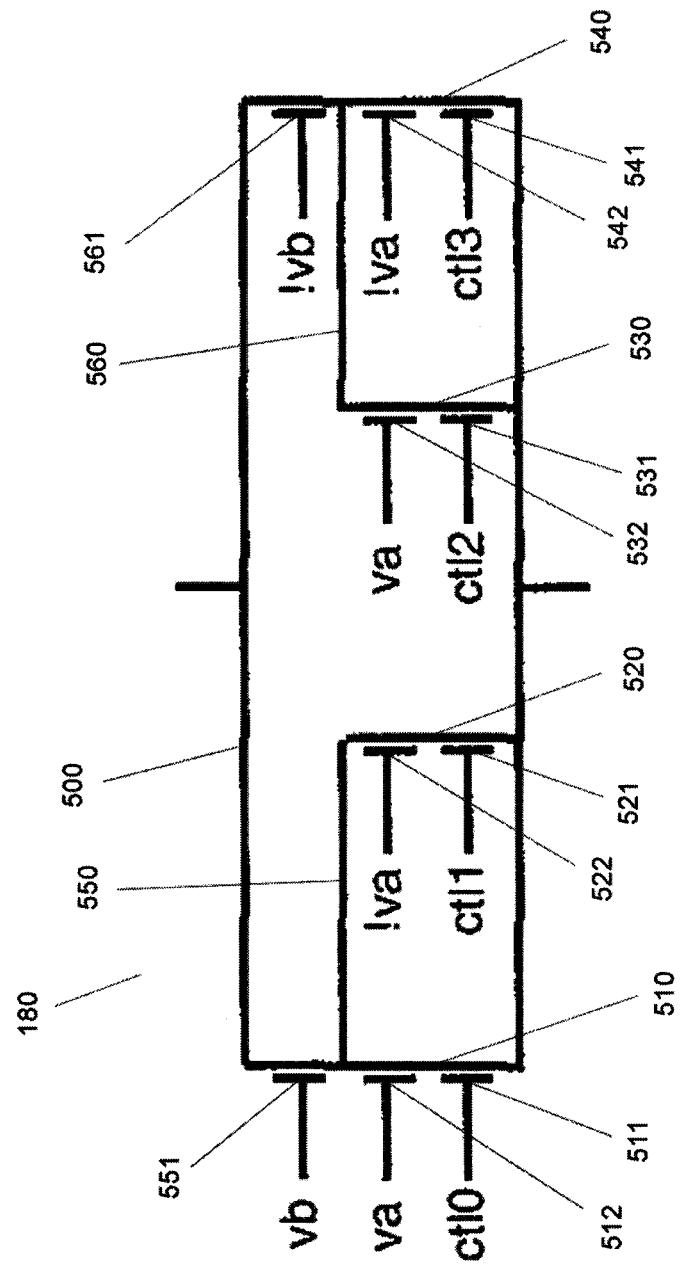
FIG. 7 shows a fifth implementation of a binary logic according to the invention implemented with an optimized evaluation network of a dynamic gate.

It is also thinkable to implement the binary logic unit according to the invention with an evaluation network 400, 500 of a dynamic gate as shown in FIGS. 6 and 7.

The binary logic unit 170 shown in FIG. 6 shows a first implementation with an evaluation network 400 of a dynamic gate. The evaluation network 400 of a dynamic gate consists of four parallel rows 410, 420, 430, 440 of three serial transistors 411, 412, 413, 421, 422, 423, 431, 432, 433, 441, 442, 443 respectively. In each row 410, 420, 430, 440 a first transistor 411, 421, 431 441 is switched by one of the control signals ctl0, ctl1, ctl2, ctl3 respectively. A second transistor

413, 423, 433, 443 within each row 410, 420, 430, 440 is switched by a first input signal $v_a$ or its inverse $!v_a$. Thereby the transistors 413, 433 are switched by the first input signal $v_a$ and the transistors 423, 443 by its inverse $!v_a$. A third transistor 412, 422, 432, 442 within each row 410, 420, 430, 440 is switched by a second input signal $v_b$ or its inverse $!v_b$. Thereby the transistors 412, 422 are switched by the second input signal $v_b$ and the transistors 423, 424 by its inverse $!v_b$. Implementing the binary logic unit 170 according to the invention with such an evaluation network 400 of a dynamic gate allows to reduce the number of transistors required to twenty-one. This is equivalent to a saving of 45% of transistors, silicon area and power leakage compared with the state of the art.

The evaluation network 500 of a dynamic gate of the binary logic unit 180 shown in FIG. 7 consists of four parallel rows 510, 520, 530, 540 of two serial transistors respectively. In each row 510, 520, 530, 540 a first transistor 511, 521, 531, 541 is switched by one of the control signals ctl0, ctl1, ctl2, ctl3 respectively and a second transistor 512, 522, 532, 542 is switched by a first input signal $v_a$ or its inverse $!v_a$. The four parallel rows 510, 520, 530, 540 are grouped to a first 550 and a second pair 560, each one comprising one row 510, 530 with a transistor 512, 532 switched by the first input signal $v_a$ and one row 520, 540 with a transistor 522, 542 switched by the inverse $!v_a$ of the first input signal respectively. Each pair 550, 560 is arranged in series to a third transistor 551, 561 respectively, wherein the third transistor 551 arranged in series to the first pair 550 is switched by a second input signal $v_b$ and the third transistor 561 arranged in series to the second pair 560 is switched by the inverse $!v_b$ of the second input signal. Implementing the binary logic unit 180 according to the invention with such an evaluation network 500 of a dynamic gate allows reducing the number of transistors required to nineteen. This is equivalent to a saving of 50% of transistors, silicon area and power leakage compared with the state of the art.

It is important to mention, that the invention allows realization of a binary logic unit with a very small number of transistors.

The implementations represent a new static CMOS realization of binary logic units. The implementations of the binary logic units according to the invention are based e.g. on AND-OR logic gates as opposed to XOR-gates in combination with multiplexers according to the state of the art.

When the circuit is mapped on a CMOS technology either an AOI-OAI logic gate will be most suited assuming a static circuit family. Compared to state of the art, using AOI-OAI (AND OR INVERT—OR AND INVERT) logic gates has the advantage of reducing the transistor count by 26% (FIG. 5). This can be directly translated to an approximately proportional decrease in area and power requirement. This reduction is achieved with an approximately equal loading of the input operands, a comparable propagation delay of the timing critical path and the same number of control signals, i.e., without any disadvantage compared to the state-of-the-art. However, regarding power and area requirement a benefit of 26% is approximated using total transistor count.

As additional advantage is the reduced delay of the input operand $v_b$ to the output as compared to the paths of $v_a$ or $v_b$ within a binary logic unit according to the state of the art.

It is important to mention, that the foregoing described above remains the same when applying the invention on situations where a Boolean operation is applied on three or more input signals. Thereby it is also advantageous to use well defined combinations of well defined control signals to define a particular Boolean operation to be applied on the input signals and to select one of the control signals by the input signals as an output signal representing the result of the particular Boolean operation applied on the input signals. Doing so also reduces cost, power consumption and requirement of silicon area in cases where an implementation for applying a Boolean operation on three or more input signals is required.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A circuit comprising:
 a logic unit for performing any selected Boolean operation in parallel on respective bits of a first multi-bit operand input and a second multi-bit operand input, the selected Boolean operation being defined by a particular combination of well defined binary control signals (ctl0, ctl1, ctl2, ctl3) provided to said logic unit, said logic unit containing a plurality of binary logic units, each applying the selected Boolean operation to a respective bit input signal (va) of said first operand input and a respective bit input signal (vb) of said second operand input, each binary logic unit comprising:
 three 2:1 multiplexers, a first multiplexer and a second multiplexer arranged in parallel to each other and a third multiplexer arranged in series to the first multiplexer and second multiplexer, wherein the respective bit input signal (va) of said first operand input and its inverting (!va) are applied on the control inputs of the first multiplexer and second multiplexer, said control signals ctl0 and ctl1 are applied on the signal inputs of the first multiplexer and said control signals ctl2 and ctl3 are applied on the signal inputs of the second multiplexer, wherein the respective bit input signal (vb) of said second operand and its inverting (!vb) are applied on the control inputs of the third multiplexer, wherein the output signal (vo1) of the first multiplexer is applied on a first data input of the third multiplexer, wherein the output signal (vo2) of the second multiplexer is applied on a second data input of the third multiplexer, and wherein the output (vo) of the third multiplexer represents the respective bit result of the selected Boolean operation specified by the four control signals (ctl0, ctl1, ctl2, ctl3) that is applied on the two respective bit input signals (va, vb).

2. A circuit comprising:
 a logic unit for performing any selected Boolean operation in parallel on respective bits of a first multi-bit operand input and a second multi-bit operand input, the selected Boolean operation being defined by a particular combination of well defined binary control signals (ctl0, ctl1, ctl2, ctl3) provided to said logic unit, said logic unit containing a plurality of binary logic units, each applying the selected Boolean operation to a respective bit input signal (va) of said first operand input and a respective bit input signal (vb) of said second operand input, each binary logic unit comprising:
 an evaluation network of a dynamic gate comprising four parallel rows of transistors, each row containing a respective transistor switched by a respective one of the control signals (ctl0, ctl1, ctl2, ctl3), each row being switched by a respective different bit combination of the respective bit input signals va and vb to select a corresponding control signal (ctl0, ctl1, ctl2, ctl3) to determine an output signal (vo) of the binary logic unit representing the result of the selected Boolean operation specified by the four control signals (ctl0, ctl1, ctl2, ctl3) applied on the respective bit input signals (va, vb), a first row corresponding to bit combination (1,1) of the respective bit input signals va and vb, a second row corresponding to bit combination (0,1) of the respective bit input signals va and vb, a third row corresponding to bit combination (1,0) of the respective bit input signals va and vb, and a fourth row corresponding to bit combination (0,0) of the respective bit input signals va and vb.

3. The circuit according to claim 2, wherein each said evaluation network of a dynamic gate consists of four parallel rows of three serial transistors respectively, wherein in each row a first transistor is switched by one of the control signals (ctl0, ctl1, ctl2, ctl3) respectively, a second transistor is switched by a first input signal (va) or its inverting signal (!va) and a third transistor is switched by a second input signal (vb) or its inverting signal (!vb).

4. The circuit according to claim 2, wherein each said evaluation network of a dynamic gate consists of four parallel rows of two serial transistors respectively, wherein in each row a first transistor is switched by one of the control signals (ctl0, ctl1, ctl2, ctl3) respectively and a second transistor is switched by a first input signal (va) or its inverting signal (!va), wherein the four parallel rows are grouped to a first and a second pair, each first and second pair comprising one row with a transistor switched by the first input signal (va) and one row with a transistor switched by the inverting signal (!va) of the first input signal respectively, wherein each pair is arranged in series to a third transistor respectively, wherein the third transistor arranged in series to the first pair is switched by a second input signal (vb) and the third transistor arranged in series to the second pair is switched by the inverting signal (!vb) of the second input signal.

\* \* \* \* \*